(12) United States Patent
Hung et al.

(10) Patent No.: US 8,238,162 B2
(45) Date of Patent: Aug. 7, 2012

(54) SYSTEM AND METHOD FOR DETECTING DISTURBED MEMORY CELLS OF A SEMICONDUCTOR MEMORY DEVICE

(75) Inventors: Chun-Hsiung Hung, Hsinchu (TW); Jeng-Kuan Lin, JuBei (TW); Kuen-Long Chang, Taipei (TW)

(73) Assignee: Macronix International Co., Ltd. (TW)

( * ) Notice: Subject to any disclaimer, the term of this patent is extended or adjusted under 35 U.S.C. 154(b) by 59 days.

(21) Appl. No.: 12/868,228

(22) Filed: Aug. 25, 2010

(65) Prior Publication Data

US 2012/0051130 A1    Mar. 1, 2012

(51) Int. Cl.
*G11C 11/34* (2006.01)
*G11C 16/04* (2006.01)
*G11C 16/06* (2006.01)
*G11C 5/06* (2006.01)

(52) U.S. Cl. .......... 365/185.2; 365/185.02; 365/185.22; 365/63

(58) Field of Classification Search .................... 365/63, 365/185.02, 185.2, 185.22
See application file for complete search history.

(56) References Cited

U.S. PATENT DOCUMENTS

| | | | |
|---|---|---|---|
| 6,735,120 | B2 | 5/2004 | Homma et al. |
| 2006/0256606 | A1* | 11/2006 | Park .............................. 365/100 |
| 2009/0237991 | A1 | 9/2009 | Kim et al. |

* cited by examiner

*Primary Examiner* — Ly D Pham
(74) *Attorney, Agent, or Firm* — Baker & McKenzie LLP

(57) ABSTRACT

A method of detecting a disturb condition of a memory cell includes application of multiple sets of conditions to the memory cell and determining whether the memory cell behaves as a programmed memory cell in response to the sets of conditions. A disturbed memory cell can be detected if the memory cell responds as a programmed memory cell in response to one of the sets of conditions, but responds as an erased memory cell in response to another of the sets of conditions.

17 Claims, 5 Drawing Sheets

SYSTEM AND METHOD FOR DETECTING DISTURBED MEMORY CELLS OF A SEMICONDUCTOR MEMORY DEVICE

BACKGROUND

1. Technical Field

The present invention relates to electronic memory devices, and more particularly, to systems and methods for detecting disturbed memory cells of semiconductor memory devices.

2. Related Art

Semiconductor memory devices are well known and commonly found in a variety of electronic devices. Most semiconductor memory devices can be classified as either volatile or nonvolatile. A volatile memory device requires power in order to maintain the stored data, while a nonvolatile memory device can retain stored data even in the absence of power.

A well known type of nonvolatile memory is flash memory. A typical flash memory includes a memory cell array in which memory cells are arranged in rows and columns. Each memory cell includes a floating gate field-effect transistor. The logic state of a memory cell depends on the threshold voltage of the transistor, which in turn depends on the number of electrons in the floating gate of the transistor. Electrons in the floating gate partially cancel the electric field from the control gate, thereby modifying the threshold voltage of the transistor. Thus, the logic state of a flash memory state can be controlled by controlling the number of electrons in the floating gate of the transistor.

A flash memory cell can be programmed and erased in order to write respective logic states to the memory cell. The program and erase operations correspond to write operations for respective logic states, which correspond to respective threshold voltages. For convenience, the threshold voltages will simply be referred to as high and low threshold voltages, with it being understood that the high threshold voltage is relatively higher than the low threshold voltage by some detectable voltage margin. The number of electrons stored in the floating gate of a memory cell transistor can be altered by applying a strong electric field between the control gate and at least one of the source, drain, and substrate of the field-effect transistor in order to remove or accumulate electrons in the floating gate. An "erase" operation can be an operation where electrons are removed from the floating gate, thereby reducing the threshold voltage of the memory cell transistor to the low threshold voltage. A "program" operation can be an operation where electrons are accumulated in the floating gate, thereby increasing the threshold voltage of the memory cell transistor to the high threshold voltage. Since erased and programmed memory cells can be readily distinguished due to the difference in threshold voltages, the erased and programmed memory cells can be used to represent different logic states. For example, an erased memory cell can be representative of a logic state "1," while a programmed memory cell can be representative of a logic state "0."

Thus, each memory cell can store one or more bits of data. For example, dual bit memory devices allow storage of two bits of data in a single memory cell, one bit being stored in a trapping layer proximate to the source region and the other being stored in a trapping layer proximate to the drain region. The presence or absence of negative changes in one area of the trapping layer may represent the status of the corresponding bit.

In multi-bit memory devices that utilize an ONO stacked layer to store charges, the charge added or removed during the programming and erase operations should be confined to the respective source and drain regions of a cell. However, in reality, the buildup and removal of charges in one of the source and drain regions may affect the charge in the other region, thus changing the reading, programming and erase characteristics of the cell over time. Eventually, the buildup of charges changes the threshold voltages for determining the state of the respective bits in a cell. The shift in threshold voltages due to the interactions between the two regions of a cell is generally known as bit disturb. Additionally, charge loss after repeated cycling of the memory cell also causes a shift in the threshold voltages, especially the program threshold voltage. The change in threshold voltages, which occurs as a result of bit disturb and/or charge loss, prevents a memory device from correctly sensing the state of each bit of the cells.

The state of each bit of a multi-bit cell, including a programmed state or in an erased state, is determined by comparing the value from a memory cell (e.g., the voltage level of a data bit) with a reference value. Generally, reference cells are pre-programmed and set to an erased state during initial manufacturing so that a stable reference value may be provided. When the value from the memory cell is greater than the reference value, the memory cell is determined to be in an erased state. On the other hand, when the value from the memory cell is less than the reference value, the memory cell is determined to be in a programmed state. FIG. 1 shows a diagram illustrating sensing margin of a memory device. The line designated as $P_{IDEAL}$ represents the ideal program threshold voltage of a memory cell over time. The line designated as $P_{DISTURBED}$ represents an example of the change in the program threshold voltage of the memory cell over time considering effects such as bit disturb and charge loss. The line designated as $E_{IDEAL}$ represents the ideal erase threshold voltage of the memory cell over time. The line designated as $E_{DISTURBED}$ represents an example of the change in the erase threshold voltages of the memory cell over time considering effects such as bit disturb and charge loss. The line designated as REF represents the reference value provided by a reference cell of a memory device in the prior art, which remains a constant value over time as shown in FIG. 1. Referring to FIG. 1, due to effects such as bit disturb and/or charge loss effect, the sensing margin between the reference value REF and the program threshold voltages $P_{DISTURBED}$ of the memory cell may decrease over time, for example from margin M1 to margin M2, which may increase the possibility of sensing errors and reduce the reliability of memory devices.

In addition, floating gate memory cells can be susceptible to certain failure modes over the lifetime of the memory device. Some such failure modes involve disturbs. Disturbs occur when reading, erasing, or programming one memory cell causes an unwanted alteration of data at another memory cell. For example, one such type of disturb is known as the "erase disturb." An erase disturb occurs whenever the data stored in a memory cell is unintentionally changed while an erasing operation is being performed on another memory cell. This can occur, for example, whenever the two memory cells share a common well. Relatively high voltages are used in order to perform an erase operation. Under certain conditions, the high erase voltage used to erase a first memory cell may unintentionally affect a second memory cell, for example causing a transfer of electrons from the floating gate of the second memory cell and thereby decreasing the threshold voltage of the second memory cell. Such unintended changes can cause unwanted data alterations and read errors to occur.

Thus, there is thus a general need in the art for effective methods of detecting and correcting disturbed memory cells in non-volatile memory devices.

SUMMARY

Disclosed herein are memory devices and methods for detecting a disturbed condition of a selected memory cell in a memory device having a reference cell. The methods may include applying a first set of conditions to the selected memory cell and the reference cell. The first set of conditions may be suitable for detecting whether the selected memory cell is programmed. The methods may further include applying a second set of conditions to the selected memory cell and the reference cell. The second set of conditions may be suitable for detecting whether the selected memory cell is programmed, and the second set of conditions is different from the first set of conditions. The methods may further include identifiing the selected memory cell as having the disturbed condition if the selected memory cell responds as having been programmed in response to only one of the first and second sets of conditions. The first set of conditions includes a word line voltage applied to the gate of the selected memory cell and a first reference word line voltage applied to the gate of the reference cell. The second set of conditions includes the word line voltage applied to the gate of the selected memory cell and a second reference word line voltage applied to the gate of the reference cell. The second reference word line voltage is less than the first reference word line voltage.

According to an aspect, the second set of conditions may include the word line voltage applied to the gate of the selected memory cell and a second reference word line voltage applied to the gate of the reference cell. The second reference word line voltage may be greater than the first reference word line voltage. According to another aspect, the first set of conditions may include a first word line voltage applied to the gate of the selected memory cell and a reference word line voltage applied to the gate of the reference cell. According to another aspect, the first set of conditions includes a bit line current applied to the selected memory cell and a first reference bit line current applied to the reference cell.

According to another aspect, the first set of conditions may include a first word line voltage applied to the gate of the selected memory cell and a reference word line voltage applied to the gate of the reference cell. According to another aspect, the first set of conditions includes a bit line current applied to the selected memory cell and a first reference bit line current applied to the reference cell.

According to another aspect, the first set of conditions includes a first bit line current applied to the selected memory cell and a reference bit line current applied to the reference cell.

The memory devices may include a memory array including a memory cell connected to a word line and a bit line, and a reference cell connected to a reference word line and a reference bit line. The word line driver may be connected to the word line, and a reference word line driver may be connected to the reference word line. At least one of the word line driver and the reference word line driver may be configured to provide first and second different voltage levels for detecting a disturbed condition of the memory cell. The word line driver may be configured to provide the first and second different voltage levels to the memory cell for detecting the disturbed condition of the memory cell. And the reference word line driver may provide a reference word line voltage to the reference cell such that the reference word line voltage is the same while the first and second different voltage levels are applied to the memory cell. According to an aspect, the reference word line driver may be configured to provide the first and second different voltage levels to the reference cell for detecting the disturbed condition of the memory cell.

A memory device may include a memory array having a memory cell connected to a word line and a bit line, and a reference cell connected to a reference word line and a reference bit line. A sense amplifier may be connected to the bit line. And a reference sense amplifier may be connected to the reference bit line. At least one of the sense amplifier and the reference sense amplifier may be configured to provide first and second different current levels for detecting a disturbed condition of the memory cell. Further, the sense amplifier may be configured to provide the first and second different current levels to the memory cell for detecting the disturbed condition of the memory cell, and the reference sense amplifier may provide a reference bit line current to the reference cell such that the reference bit line current level is the same while the first and second different current levels are applied to the memory cell.

According to an aspect, the reference sense amplifier is configured to provide the first and second different current levels to the reference cell for detecting the disturbed condition of the memory cell. The sense amplifier may provide a bit line current level to the memory cell such that the bit line current level is the same while the first and second different current levels are applied to the reference cell.

BRIEF DESCRIPTION OF THE DRAWINGS

Features, aspects, and embodiments of the inventions are described in conjunction with the attached drawings.

DETAILED DESCRIPTION

Figure 1:
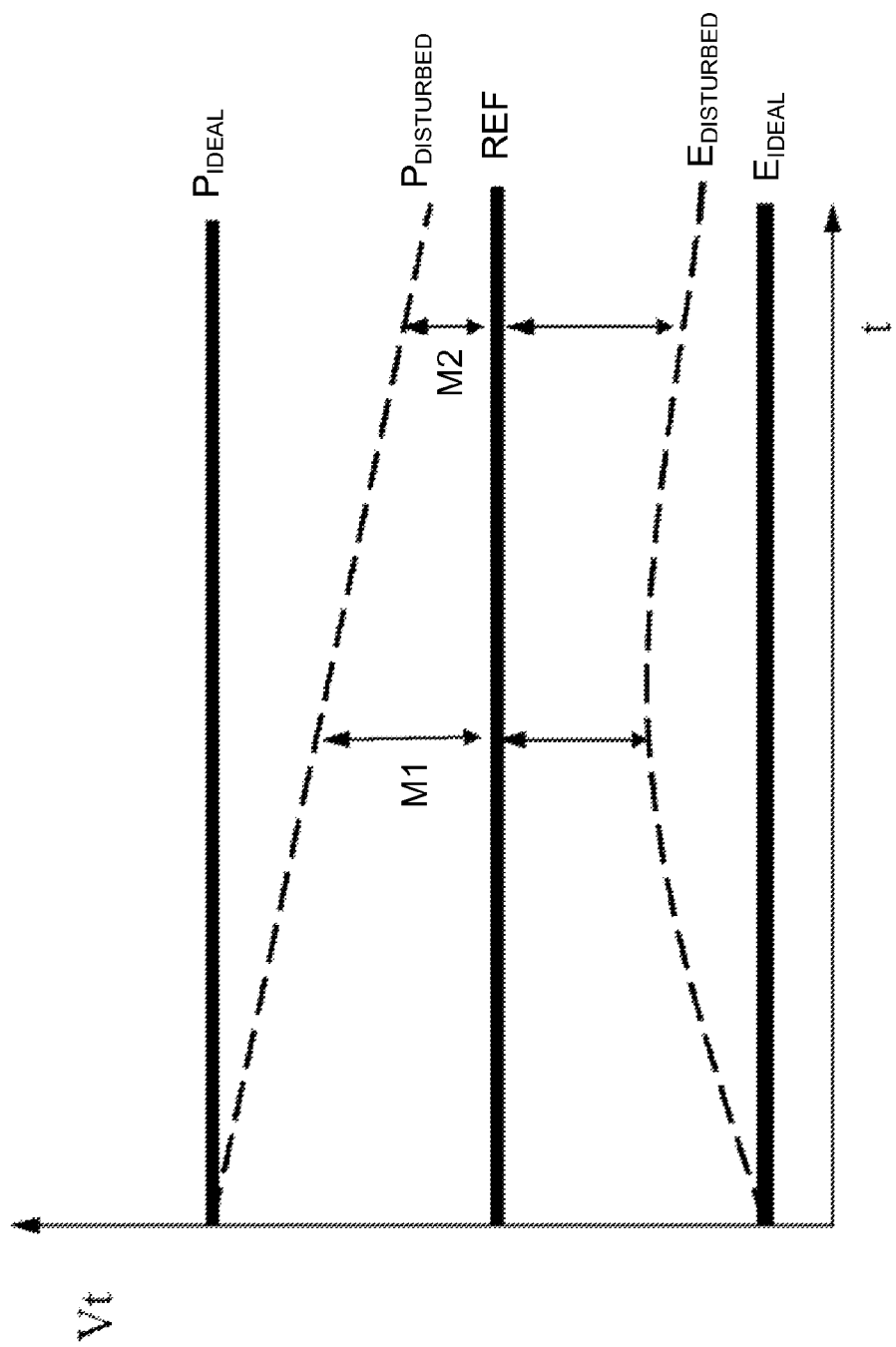
FIG. 1 shows a diagram of the sensing margin of a memory device.
Figure 2:
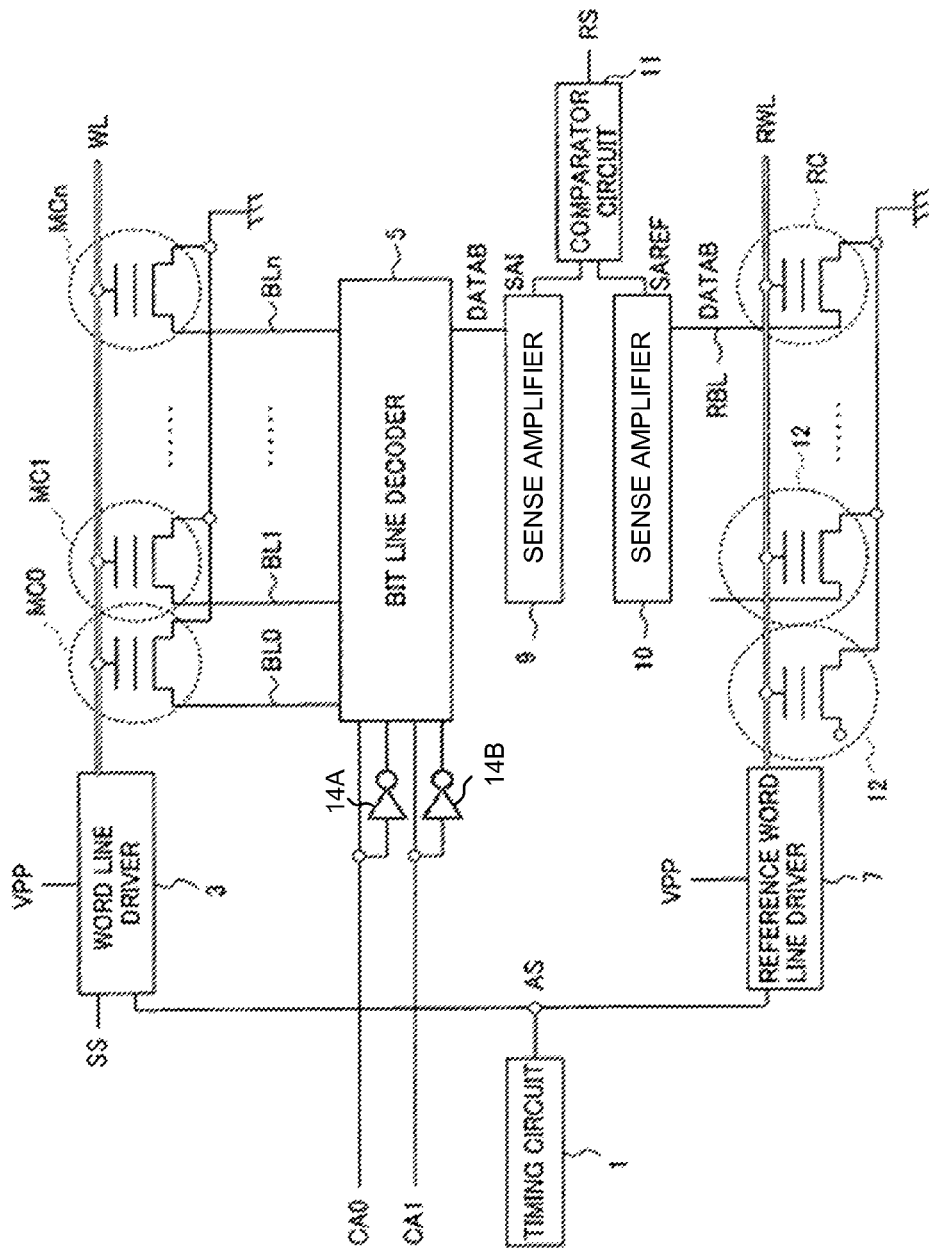
FIG. 2 shows a block diagram of a memory device in accordance with the present disclosure.

FIG. 2 shows a schematic block diagram of an example of a non-volatile semiconductor memory device. The memory device shown in FIG. 2 serves as an example of a memory device to which concepts disclosed herein can be applied in order to allow for improved detection of disturbed memory cells. Those skilled in the art will appreciate that the architecture of the memory device can vary without departing from the spirit and scope of the present disclosure.

The memory device shown in FIG. 2 is a non-volatile semiconductor memory device that includes a timing circuit 1, a word line driver 3, a bit line decoder 5, a reference word line driver 7, sense amplifiers 9 and 10, a comparator circuit 11, dummy cells 12, memory cells MC0 to MCn, a reference cell RC, a word line WL, a reference word line RWL, bit lines BL0 to BLn, and a reference bit line RBL.

The word line driver 3 and the reference word line driver 7 are connected to the timing circuit 1, and drive the word line WL and the reference word line RWL, respectively. In some embodiments, the reference word line driver 7 can output multiple RWL voltage levels for detecting a disturbed memory cell MC, for example as described below in connection with FIG. 3. Also, in some embodiments, the word line driver 3 can output multiple WL voltage levels for detecting a disturbed memory cell MC, for example as described below in connection with FIG. 5.

A booster power voltage VPP is supplied to the word line driver 3 and the reference word line driver 7. An activation signal AS for activating each driver is supplied from the timing circuit 1. The word line driver 3 selects the word line WL for activation, in accordance with a select signal SS.

The gate of each of the memory cells MC0 to MCn is connected to the word line WL, while the source is grounded. The bit lines BL0 to BLn are selectively activated by the bit line decoder 5, in accordance with column address signals CA0 and CA1 and their inversion signals /CA0 and /CA1, which are the generated by inverters 14A and 14B, respectively. For example, when high-level column address signals /CA0 and /CA1 are supplied to the bit line decoder 5, the bit line BL0 is activated, and data DATAB is read out from the memory cell MC0 and provided to the sense amplifier 9; when high-level column address signals CA0 and /CA1 are supplied to the bit line decoder 5, the bit line BL1 is activated, and the data DATAB is read out from the memory cell MC1 and provided to the sense amplifier 9.

Like the memory cells MC0 to MCn, the gate of the reference cell RC is connected to the reference word line RWL, while the source is grounded. The drain of the reference cell RC is connected to the reference bit line RBL. The dummy cells 12 as the equivalents of the memory cells MC0 to MC(n−1) are also connected to the reference word line RWL.

The sense amplifier 9 is connected to the bit line decoder 5, and the sense amplifier 10 is connected to the reference bit line RBL. The comparator circuit 11 is connected to the sense amplifiers 9 and 10.

In the sense amplifier 10, a signal SAREF corresponding to data DATAB read out from the reference cell RC is supplied to the comparator circuit 11. In other words, the sense amplifier 10 generates the signal SAREF having a voltage corresponding to a cell current flowing through the reference cell RC, and supplies the signal SAREF to the comparator circuit 11.

The sense amplifier 9 can have the same structure as the sense amplifier 10, and can generate a signal SAI that has a voltage depending on a cell current flowing through a selected memory cell MC. The generated signal SAI is also supplied to the comparator circuit 11.

Thus, cell currents flowing through a selected memory cell MC and the reference cell RC are converted into voltages, and the comparator circuit 11 then compares the voltages. A comparison result signal RS depending on the relationship between the threshold voltages of the reference cell and the memory cell is obtained. In accordance with the comparison result signal RS, it is determined whether the read data is "1" or "0".

In some embodiments, the sense amplifier 9 can output multiple current levels to a memory cell MC selected by the bit line decoder 5 for detecting a disturbed condition of the selected memory cell MC, for example as described below in connection with FIG. 5. Also, in some embodiments, the sense amplifier 10 can output multiple current levels to reference cell RC for detecting a disturbed condition of a selected memory cell MC, for example as described below in connection with FIG. 5.

Figure 3:
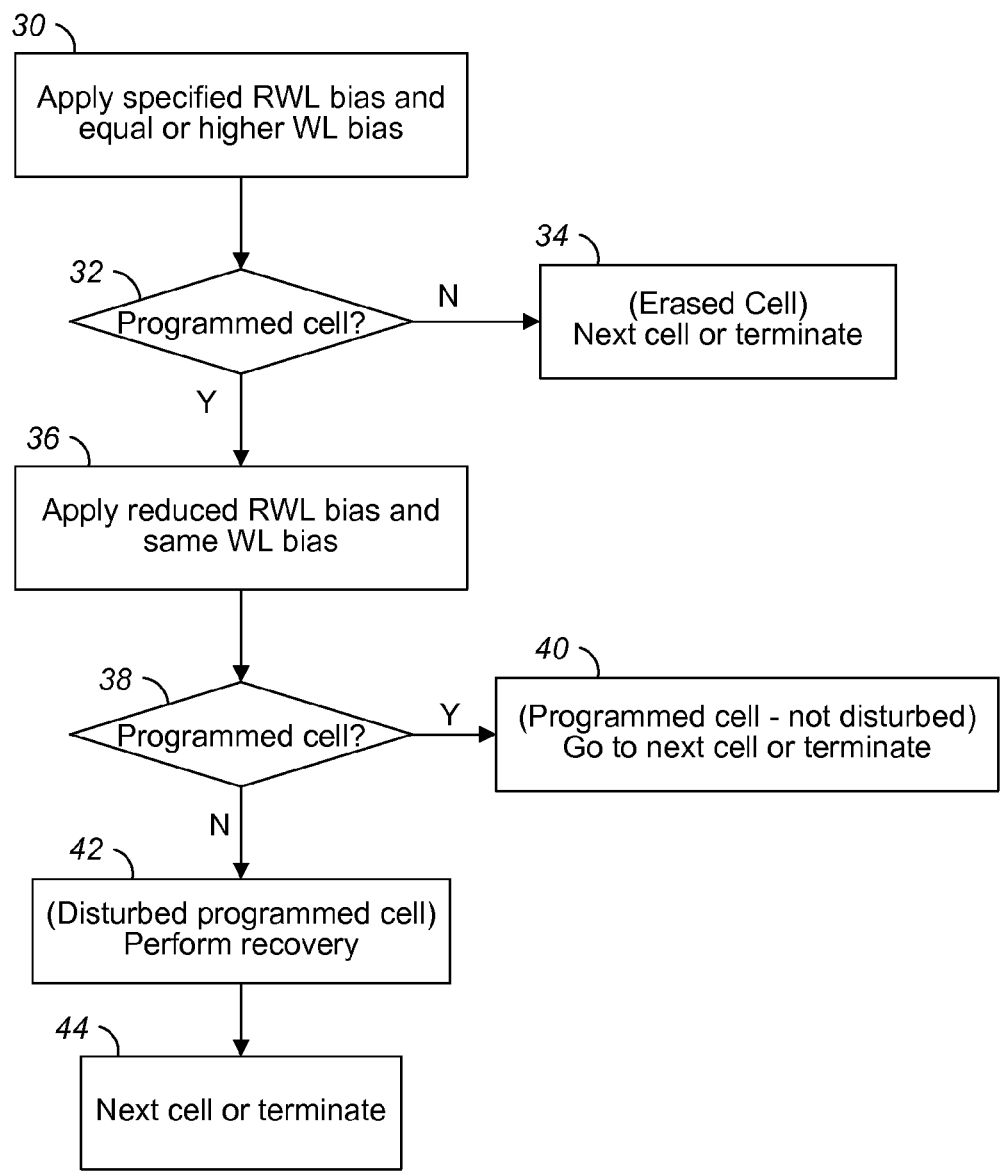
FIG. 3 shows a flowchart of a process for detecting a disturbed memory cell.
Figure 4:
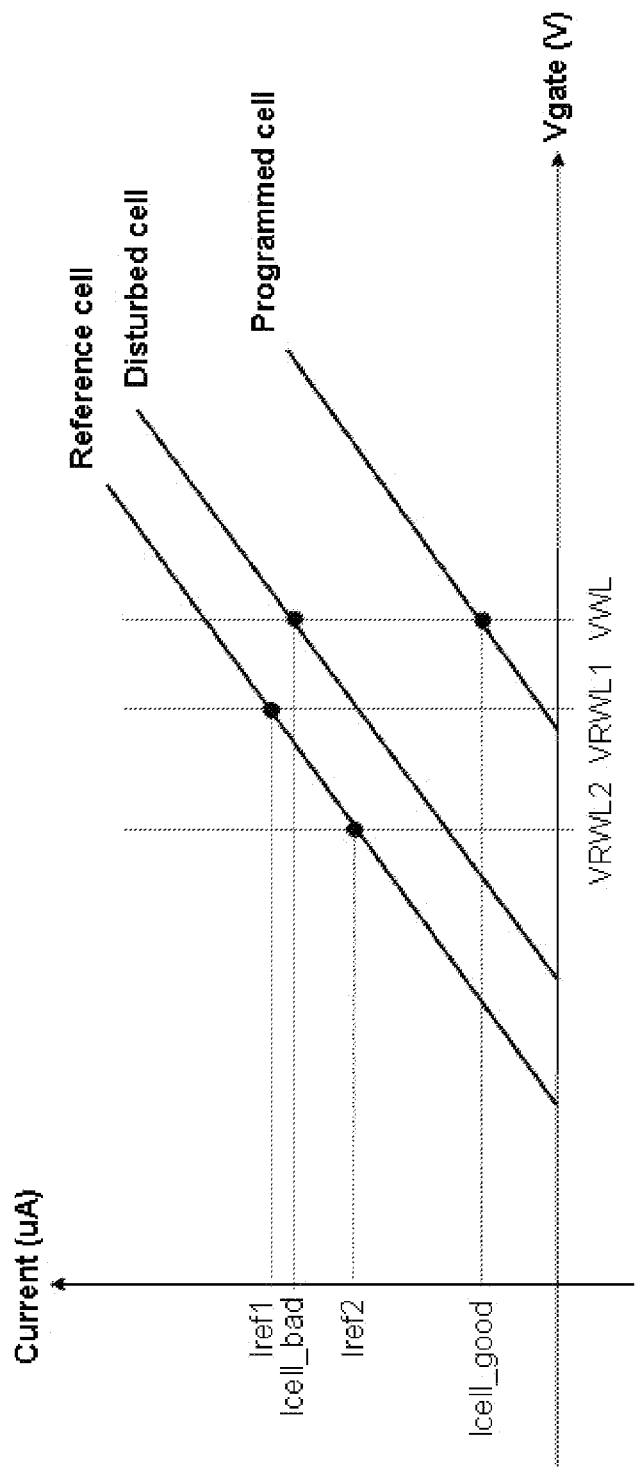
FIG. 4 shows a diagram of relative behaviors of a reference cell, a programmed memory cell, and a disturbed memory cell.

Referring next to FIGS. 3 and 4, an embodiment of a method of detecting a disturbed memory cell will be described. FIG. 3 shows a flowchart that illustrates a flow of an embodiment of a disturbed-cell detection process, and FIG. 4 shows a graph for illustrating certain aspects of the process.

At block 30, a specified reference wordline (RWL) voltage is applied to the gate of the reference cell, while an equal or higher voltage is applied to the gate of a memory cell in question. Referring to FIG. 4, this first RWL voltage can be the voltage level designated as voltage VRWL1, while the word line voltage can be the voltage level designated as voltage VWL. While the word line voltage shown in FIG. 4 is greater than the first reference wordline voltage VRWL1, in some embodiments the wordline voltage VWL can be equal to the first reference wordline voltage VRWL1. In a normally operating programmed memory cell, the threshold voltage of the programmed cell should exceed the threshold voltage of the reference cell. So, the current Icell_good from the programmed cell should be lower than the first reference current Iref1 from the reference cell. If this relationship is detected at block 32, then the memory cell in question is identified as being a programmed memory cell, and so the process continues to block 36. Otherwise, as shown at block 34, either the process terminates or the process begins again for another memory cell.

At block 36, a second specified RWL voltage VRWL2 is applied to the gate of the reference cell, while the same word line voltage VWL used at block 30 is again applied to the gate of the memory cell in question. Referring again to FIG. 4, this second RWL voltage VRWL2 can be lower than the first RWL voltage VRWL1. In a normally operating programmed memory cell, the threshold voltage of the programmed cell should exceed the threshold voltage of the reference cell by a large enough margin that the second RWL voltage VRWL2 should still exceed the programmed threshold voltage of the memory cell in question. So, the current Icell_good from the programmed cell should still be lower than the second reference current Iref2 from the reference cell.

If this relationship is detected at block 38, then the memory cell in question is identified as being a good programmed memory cell, and so the process continues to block 40 where either the process terminates or the process begins again for another memory cell.

Otherwise, as shown in block 42, the memory cell in question is identified as being a disturbed memory cell. Referring again to FIG. 4, in a disturbed memory cell, some amount of electrons have been unintentionally discharged from the floating gate, for example due to stray voltage from an erase operation performed on another memory cell. For example, an erase operation performed on another memory cell that shares a p-well with the memory cell in question may have unintentionally caused some number of electrons to have been discharged from the floating gate of the memory cell in question. As a result, the memory cell in question has an abnormally high threshold voltage. As shown in FIG. 4, if the memory cell is question is thus a disturbed memory cell, the threshold voltage can be between such that for the applied word line voltage VWL, the resulting current Icell_bad exceeds that of the reference cell when the second RWL voltage VRWL2 is applied at block 36. Accordingly, at block 42, a recovery operation is performed for taking corrective action on the disturbed memory cell. For example, the memory cell can be re-programmed at block 42. Finally, at block 44, either the process terminates or the process begins again for another memory cell.

Alternatively, the blocks 30 and 36 can be reversed, such that the RWL voltage used at block 30 is less than the RWL voltage used at block 36. For example, the second RWL voltage VRWL2 can be used at block 30, and the first RWL voltage VRWL1 can be used at block 36.

Still further alternatives will be described with reference to FIG. 5. FIG. 5 shows a more generalized version of the flowchart shown in FIG. 3 for the purpose of explaining some of the various alternatives to the embodiment described in connection with FIG. 3.

Figure 5:
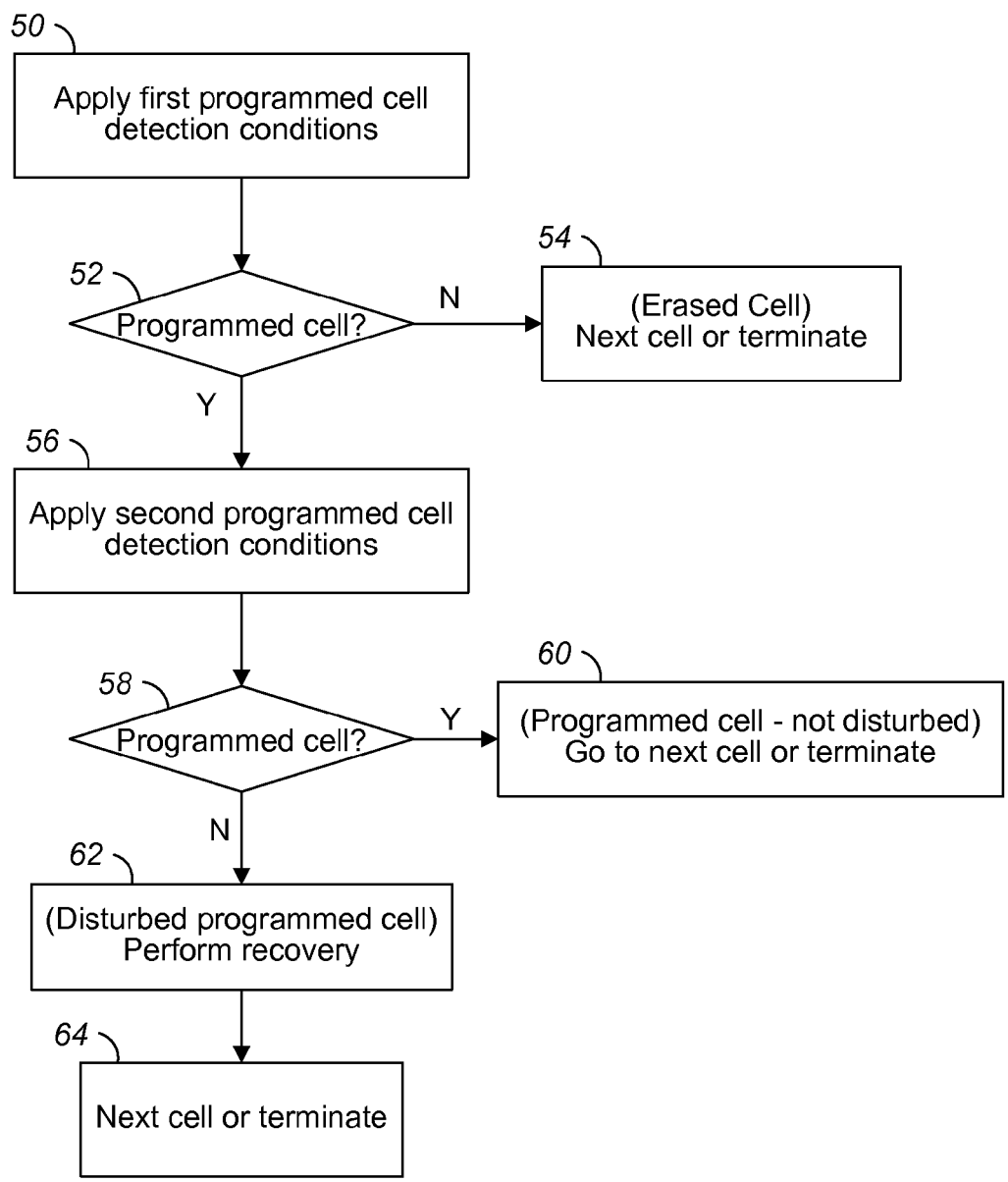
FIG. 5 shows a flowchart of a process for detecting a disturbed memory cell.

In general, the flowchart shown in FIG. 5 is similar to that of FIG. 3, except for the blocks 50 and 56. At block 50, a first set of conditions are applied to both the reference cell and the memory cell in question. The conditions are such that the memory cell in question may be identified as a programmed cell at block 52. If the memory cell is identified as being a programmed memory cell, then the process continues to block 56. Otherwise, as shown at block 54, either the process terminates or the process begins again for another memory cell. At block 56, a second set of conditions are applied to both the reference memory cell and the memory cell in question. The second set of conditions differ in some way from the first set of conditions (block 50), but are still such that the memory cell in question should behave as would be expected from a normally-operating programmed memory cell. If the memory cell in question still provides a result that would be expected from a programmed memory cell, then the memory cell in question is identified as being a good programmed memory cell, and so the process continues to block 60 where either the process terminates or the process begins again for another memory cell. Otherwise, as shown in block 62, the memory cell in question is identified as being a disturbed memory cell. Accordingly, at block 62, a recovery operation is performed for taking corrective action on the disturbed memory cell. For example, the memory cell can be re-programmed at block 62. Finally, at block 64, either the process terminates or the process begins again for another memory cell.

Table 1 below summarizes some of the options for blocks 50 and 56:

TABLE 1

|  | Block 50 | Block 56 |
| --- | --- | --- |
| Alternative I | VRWL fixed; VWL1 | VRWL fixed; VWL2 |
| Alternative II | Iref1; Iwl fixed | Iref2; Iwl fixed |
| Alternative III | Iref fixed; Iwl1 | Iref fixed; Iwl2 |

According to Alternative I, reference word line voltage VRWL is kept constant for blocks 50 and 56. Respective first and second word line voltages VWL1 and VWL2 are used for blocks 50 and 56. For example, referring to FIG. 2, if the reference word line voltage VRWL is kept at a level equal to VRWL1, and the word line voltage VWL 1 is set equal to VWL at block 50, then at block 56 the word line voltage can be increased somewhat and the detected current from the memory cell in question should still be less than Iref1. However, for the disturbed cell, when the word line voltage is increased, the current may equal or exceed that of the reference cell current Iref1, so the cell can be identified as being a disturbed memory cell. Alternatively, in some embodiments of Alternative I, the higher word line voltage can instead be applied at block 50 and the lower word line voltage can instead be applied at block 56.

According to Alternative II, this alternative embodiment is similar to the embodiment described above in connection with FIG. 3, except that applied reference bit line currents are varied instead of the reference wordline voltages. According to Alternative III, this alternative is similar to Alternative I, except that applied bit line currents to the memory cell in question are varied instead of the wordline voltages to the memory cell in question. It will also be appreciated that the polarity of data output from the sense amplifiers can similarly be used for detecting disturbed memory cells.

Also, while various embodiments have been described wherein one or the other of a word line voltage and a reference word line voltage is changed while the other remains fixed, alternative embodiments can include changing both the word line voltage and the reference word line voltage. For example, in some embodiments of Alternative I, two different word line voltages can be used for blocks 50 and 56, respectively, even while two different reference word line voltages are also used for blocks 50 and 56, respectively, so long as the conditions at blocks 50 and 56 would both be suitable for detecting a programmed memory cell. Similarly, in some embodiments of Alternatives II and III, two different bit line currents can be used for blocks 50 and 56, respectively, even while two different reference bit line currents are also used for blocks 50 and 56, respectively, so long as the conditions at blocks 50 and 56 would both be suitable for detecting a programmed memory cell.

While various embodiments in accordance with the disclosed principles have been described above, it should be understood that they have been presented by way of example only, and are not limiting. Thus, the breadth and scope of the invention(s) should not be limited by any of the above-described exemplary embodiments, but should be defined only in accordance with the claims and their equivalents issuing from this disclosure. Furthermore, the above advantages and features are provided in described embodiments, but shall not limit the application of such issued claims to processes and structures accomplishing any or all of the above advantages.

Additionally, the section headings herein are provided for consistency with the suggestions under 37 C.F.R. 1.77 or otherwise to provide organizational cues. These headings shall not limit or characterize the invention(s) set out in any claims that may issue from this disclosure. Specifically and by way of example, although the headings refer to a "Technical Field," such claims should not be limited by the language chosen under this heading to describe the so-called technical field. Further, a description of a technology in the "Background" is not to be construed as an admission that technology is prior art to any invention(s) in this disclosure. Neither is the "Summary" to be considered as a characterization of the invention(s) set forth in issued claims. Furthermore, any reference in this disclosure to "invention" in the singular should not be used to argue that there is only a single point of novelty in this disclosure. Multiple inventions may be set forth according to the limitations of the multiple claims issuing from this disclosure, and such claims accordingly define the invention(s), and their equivalents, that are protected thereby. In all instances, the scope of such claims shall be considered on their own merits in light of this disclosure, but should not be constrained by the headings set forth herein.

What is claimed is:

1. A method for detecting a disturbed condition of a selected memory cell in a memory device having a reference cell, the method comprising:

applying a first set of conditions to the selected memory cell and the reference cell, the first set of conditions being suitable for detecting whether the selected memory cell is programmed;

applying a second set of conditions to the selected memory cell and the reference cell, the second set of conditions being suitable for detecting whether the selected memory cell is programmed, and the second set of conditions being different from the first set of conditions; and identifying the selected memory cell as having the disturbed condition if the selected memory cell responds as having been programmed in response to only one of the first and second sets of conditions, wherein the first set of conditions includes a word line voltage applied to the gate of the selected memory cell, and a first reference word line voltage applied to the gate of the reference cell, and wherein the second set of conditions includes the word line voltage applied to the gate of the selected memory cell, and a second reference word line voltage applied to the gate of the reference cell, wherein the second reference word line voltage is less than the first reference word line voltage.

2. The method of claim 1, wherein the second set of conditions includes the word line voltage applied to the gate of the selected memory cell, and a second reference word line voltage applied to the gate of the reference cell, wherein the second reference word line voltage is greater than the first reference word line voltage.

3. The method of claim 1, wherein the first set of conditions includes a first word line voltage applied to the gate of the selected memory cell, and a reference word line voltage applied to the gate of the reference cell.

4. The method of claim 3, wherein the second set of conditions includes a second word line voltage applied to the gate of the selected memory cell, and the reference word line voltage applied to the gate of the reference cell, wherein the second word line voltage is less than the first word line voltage.

5. The method of claim 3, wherein the second set of conditions includes a second word line voltage applied to the gate of the selected memory cell, and the reference word line voltage applied to the gate of the reference cell, wherein the second word line voltage is greater than the first word line voltage.

6. The method of claim 1, wherein the first set of conditions includes a bit line current applied to the selected memory cell, and a first reference bit line current applied to the reference cell.

7. The method of claim 6, wherein the second set of conditions includes the bit line current applied to the selected memory cell, and a second reference bit line current applied to the reference cell, wherein the second reference bit line current is less than the first reference bit line current.

8. The method of claim 6, wherein the second set of conditions includes the bit line current applied to the selected memory cell, and a second reference bit line current applied to the reference cell, wherein the second reference bit line current is greater than the first reference bit line current.

9. The method of claim 1, wherein the first set of conditions includes a first bit line current applied to the selected memory cell, and a reference bit line current applied to the reference cell.

10. The method of claim 9, wherein the second set of conditions includes a second bit line current applied to the selected memory cell, and the reference bit line current applied to the reference cell, wherein the second bit line current is less than the first bit line current.

11. The method of claim 9, wherein the second set of conditions includes a second bit line current applied to the selected memory cell, and the reference bit line current applied to the reference cell, wherein the second bit line current is greater than the first bit line current.

12. A memory device comprising:
a memory array comprising a memory cell connected to a word line and a bit line, and a reference cell connected to a reference word line and a reference bit line;
a word line driver connected to the word line; and
a reference word line driver connected to the reference word line, wherein at least one of the word line driver and the reference word line driver is configured to provide first and second different voltage levels for detecting a disturbed condition of the memory cell,
wherein the word line driver is configured to provide the first and second different voltage levels to the memory cell for detecting the disturbed condition of the memory cell, and
wherein the reference word line driver provides a reference word line voltage to the reference cell such that the reference word line voltage is the same while the first and second different voltage levels are applied to the memory cell.

13. The memory device of claim 12, wherein the reference word line driver is configured to provide the first and second different voltage levels to the reference cell for detecting the disturbed condition of the memory cell.

14. The memory device of claim 13, wherein the word line driver provides a word line voltage to the memory cell such that the word line voltage is the same while the first and second different voltage levels are applied to the reference cell.

15. A memory device comprising:
a memory array comprising a memory cell connected to a word line and a bit line, and a reference cell connected to a reference word line and a reference bit line;
a sense amplifier connected to the bit line; and
a reference sense amplifier connected to the reference bit line, wherein at least one of the sense amplifier and the reference sense amplifier is configured to provide first and second different current levels for detecting a disturbed condition of the memory cell,
wherein the sense amplifier is configured to provide the first and second different current levels to the memory cell for detecting the disturbed condition of the memory cell, and
wherein the reference sense amplifier provides a reference bit line current to the reference cell such that the reference bit line current level is the same while the first and second different current levels are applied to the memory cell.

16. The memory device of claim 15, wherein the reference sense amplifier is configured to provide the first and second different current levels to the reference cell for detecting the disturbed condition of the memory cell.

17. The memory device of claim 16, wherein the sense amplifier provides a bit line current level to the memory cell such that the bit line current level is the same while the first and second different current levels are applied to the reference cell.

* * * * *